United States Patent
Huang

(10) Patent No.: US 6,768,330 B2
(45) Date of Patent: Jul. 27, 2004

(54) IC COMPONENT TEST SOCKET ASSEMBLY HAVING ERROR PROTECTION DEVICE

(75) Inventor: David Huang, Hsin Tien (TW)

(73) Assignee: VIA Technologies, Inc., Hsin Tien (TW)

(*) Notice: Subject to any disclaimer, the term of this patent is extended or adjusted under 35 U.S.C. 154(b) by 0 days.

(21) Appl. No.: 10/322,507

(22) Filed: Dec. 19, 2002

(65) Prior Publication Data

US 2004/0004490 A1 Jan. 8, 2004

(30) Foreign Application Priority Data

Jul. 5, 2002 (TW) .................................. 91210266 U

(51) Int. Cl.[7] .............................................. G01R 31/02
(52) U.S. Cl. ...................................... 324/755; 324/758
(58) Field of Search ................................ 324/755, 754, 324/758, 765; 250/559.12, 559.14, 559.15, 559.29, 559.36, 559.4

(56) References Cited

U.S. PATENT DOCUMENTS

| | | | | |
|---|---|---|---|---|
| 4,405,233 A | * | 9/1983 | Grau | 356/237.1 |
| 6,218,849 B1 | * | 4/2001 | Kiyokawa | 324/755 |
| 6,388,457 B1 | * | 5/2002 | Loh et al. | 324/755 |
| 6,466,045 B1 | * | 10/2002 | Tran | 324/755 |

* cited by examiner

Primary Examiner—Ernest Karlsen
(74) Attorney, Agent, or Firm—Birch, Stewart, Kolasch & Birch, LLP

(57) ABSTRACT

An IC component test socket assembly having an error protection device includes a test socket, a first detection device set and a control unit. The IC component test socket assembly serves to detect whether the IC component is correctly inserted into the test socket and determine whether further electric functionality test operations for the IC component is going to be performed or not. A second detection device set is further provided in the test socket, and a mark is provided on an IC component to enhance the functionality of this test socket assembly. Moreover, the IC component test socket assembly is applicable to semi-automatic or completely automatic system level test equipments to avoid burnout of IC components and damages to the test equipments.

12 Claims, 6 Drawing Sheets

IC COMPONENT TEST SOCKET ASSEMBLY HAVING ERROR PROTECTION DEVICE

BACKGROUND OF THE INVENTION

1. Field of the Invention

The present invention relates to an IC component test socket assembly; and more particularly, to an IC component test socket assembly having an error protection device.

2. Description of the Prior Art

During the functionality test process of an IC component, the IC component is usually manually placed into a test socket for relevant tests. As placing an IC component into the test socket, it is necessary to take the orientation, position, and exactness of the placement into account. Many widely-used IC components, such as the central processing units (CPUs) are square. There are four different but symmetric orientations for matching the square IC component with the square socket. Each two adjacent orientations of the four orientations differ by 90 degrees on the matching plane. However, only one orientation is correct for matching, i.e., only when the IC component is inserted into the test socket in the correct one orientation, the functionality test can be performed correctly without damage to either the test equipment including the test socket or the tested IC components. The reason is that each of the contacts in test has been defined for a specific use according the specification of the tested IC component. Incorrect insertion of the tested IC component into the test socket can lead to mechanical and/or electrical damages. When an IC component is rectangular, there are two different but symmetric orientations for matching the IC component and test socket. They differ by 180 degrees on the matching plane. Therefore, it is also necessary to take the wrong orientation, if happens, into account. For IC components with other shapes, the problem of course needs to be considered if they are rotationally symmetrical in shape.

As shown in FIG. 1, an IC component 10 is placed into a conventional test socket 20a in a wrong orientation. For a correct placement, an orientation mark (first mark) 11 on the IC component 10 has to be aligned with an orientation mark (second mark) on the test socket 20a. In the figure, however, the first mark 11 is not aligned with the second mark 22a.

As shown in FIG. 2, the IC component 10 is not placed into the conventional test socket 20a in a matched manner from a horizontal viewpoint. For a correct placement, the IC component 10 should be completely inserted into the groove 21a without any horizontal tilt. In the figure, however, the IC component 10 is not completely inserted into the groove 21a of the test socket 20a.

Because there are a vast number (ten thousands to millions each month) of the IC components 10 to be tested, it is inevitable that some of the IC components 10 are slantingly placed into the test socket 20a due to some inadvertences. If an operator slantingly places the IC component 10 into the test socket 20a inadvertently and then performs corresponding functionality tests for the IC component 10, erroneous test results will be obtained, therefore increasing the possibility of misjudgment. The worst scenario is the burnout of the IC component 10 or damage to the test socket 20a or even the test equipment due to component misplacement, thus increasing the total cost and reducing the throughput of products.

SUMMARY OF THE INVENTION

A first objective of the present invention is to provide an IC component test socket assembly having an error protection device, so as to avoid burnout of the IC component or destruction of the test equipment when the IC component is incorrectly inserted into a test socket due to some inadvertences.

A second objective of the present invention is to provide an IC component test socket assembly having an error protection device, so as to prevent an IC component from being inserted into a test socket with an incorrect orientation, thereby letting the IC component be correctly tested by the test equipment.

A third objective of the present invention is to provide an IC component test socket assembly having an error protection device, so as to prevent an IC component from being placed in a test socket in a horizontal imbalance situation, thereby letting the IC component be tightly in electrical connection to the test socket and correctly tested by the test equipment.

A fourth objective of the present invention is to provide an IC component test socket assembly having an error protection device, thereby to stop the electric functionality test of an IC component if the IC component is erroneously inserted into a test socket, so as to avoid the burnout of the IC component or damage of the test equipment.

A fifth objective of the present invention is to provide an IC component test socket assembly having an error protection device, sending out a signal to inform an operator of checking and correcting the error so as to facilitate subsequent operations when an IC component is erroneously placed into a test socket A sixth objective of the present invention is to provide an IC component test socket assembly having an error protection device, which is applicable to semi-automatic or completely automatic system level test equipments, which perform electric functionality tests for an IC component in a semi-automatic or completely automatic testing way, to ensure that the IC component is accurately tested by the test equipment.

To achieve the above objects, the present invention relates to an error protection device used in detecting the orientation and position of an IC component. The present invention comprises a test socket, a first detection device, set, a second detection device set, a control unit, and a first mark disposed on the IC component. The first detection device set comprises a first signal emission unit and a first signal reception unit. The second detection device set comprises a second signal emission unit and a second signal reception unit. The first and the second detection device set are fixedly mounted onto the test socket. The IC component will be inserted into the test socket for tests. The first signal emission unit of the first detection device set serves to emit out a signal to let the corresponding first reception unit receive the signal, thereby determining whether the IC component is inserted into the test socket in a horizontally balanced manner. Simultaneously, the first mark on the IC component is utilized to let the signal emitted out by the second signal emission unit be reflected and then received by the second signal reception unit, thereby determining whether the IC component is inserted into the test socket with the correct orientation. The control unit serves to integrate detection results of the first and the second detection device sets, thereby determining whether further electric functionality tests for the IC component are going to be performed or not. The IC component test socket assembly having an error protection device is applicable to semi-automatic or completely automatic system level test equipments, so as to avoid damage of both the IC components and the test equipment during electric functionality tests.

The various objects and advantages of the present invention will be more clearly understood from the following detailed description when read in conjunction with the appended drawing, in which:

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENT

Figure 1:
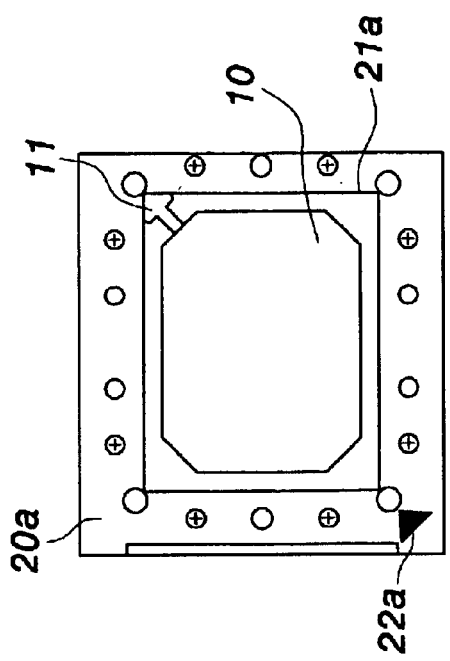
FIG. 1 is a top view showing the wrong orientation situation of an IC component in the prior art.
Figure 2:
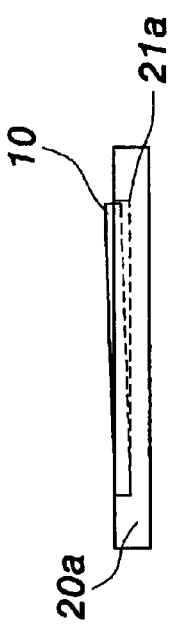
FIG. 2 is a side view showing that an IC component is inserted into a groove of a test socket with the horizontal imbalance in the prior art.
Figure 3:
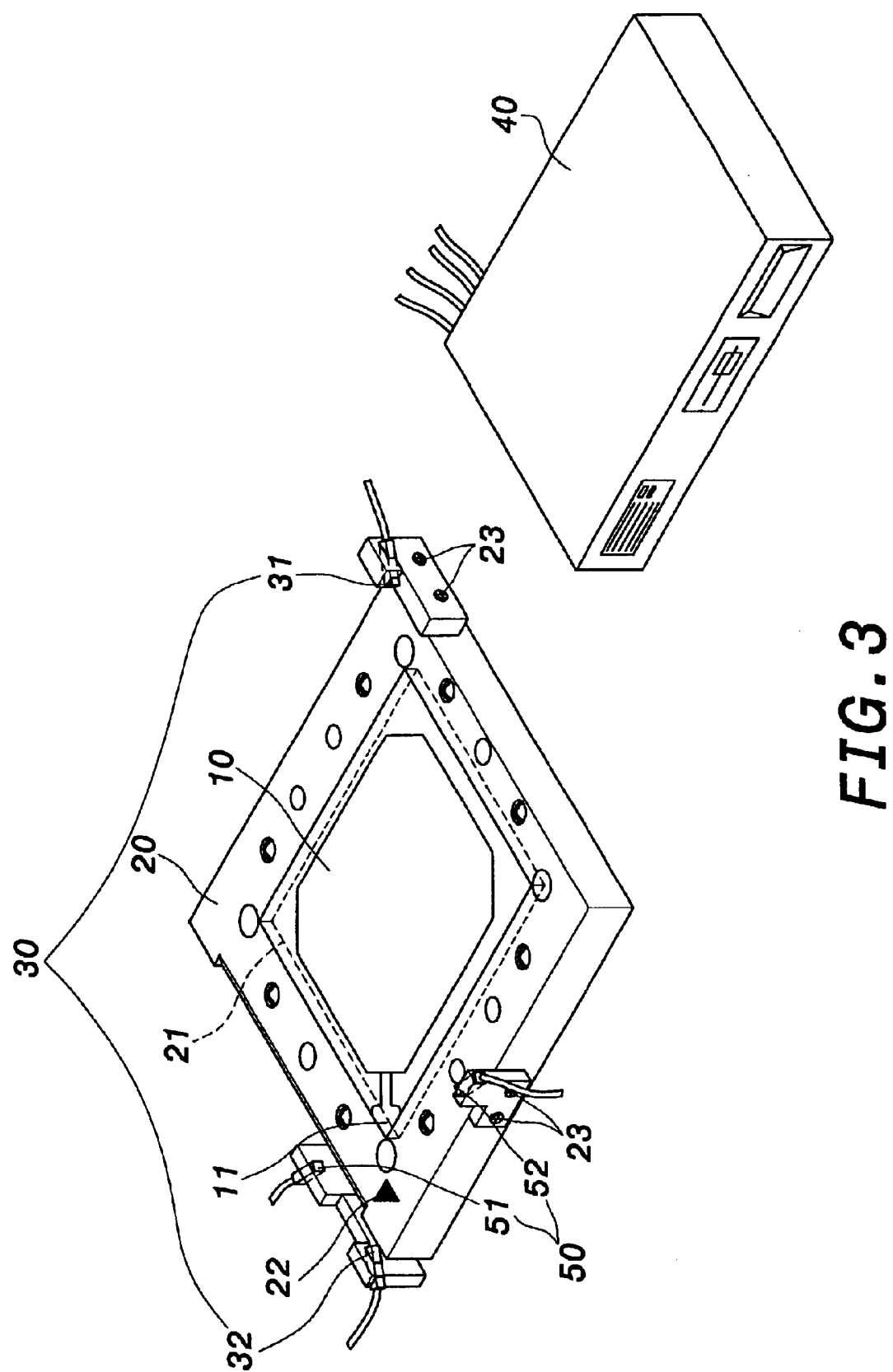
FIG. 3 is a perspective view of an IC component test socket assembly having an error protection device of the present invention.

As shown in FIG. 3, the present invention provides an IC component test socket assembly having an error protection device, which serves to detect whether the IC component is with a correct orientation and horizontal balance. This invention includes a test socket 20, a first detection device set 30, a second detection device set 50, a control unit 40, and a first mark disposed on an IC component 10. The IC component 10 is placed into a groove 21 of the test socket 20. The first and the second detection device sets 30 and 50 are fixed on the test socket 20 with screws 23. The test socket 20 is disposed on and electrically connected to a test circuit board (not shown). The test circuit board can be an add-on card inserted on a motherboard or a test motherboard.

Figure 4:
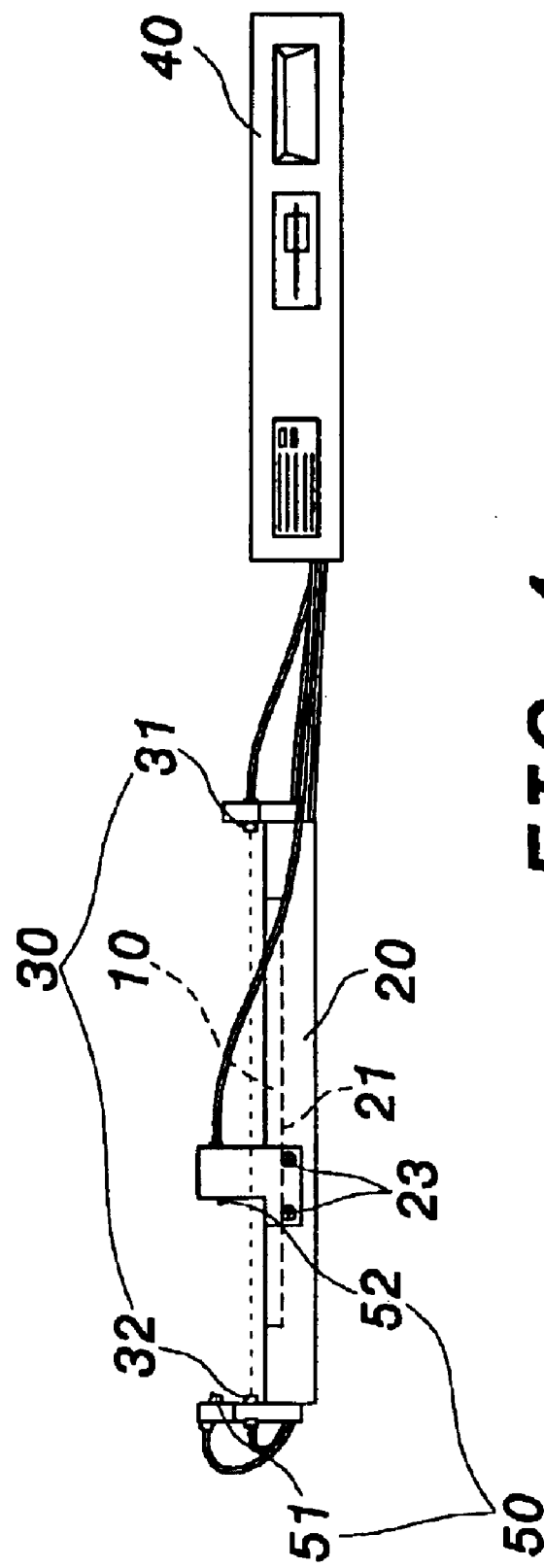
FIG. 4 is a side view of an IC component test socket assembly having an error protection device of the present invention, wherein an IC component is inserted into a groove of a test socket without horizontal imbalance.

As shown in FIG. 4, the IC component 10 is inserted into the groove 21 of the test socket 20 for electrical functionality tests, which require the IC component 10 to be inserted into the groove 21 of the test socket 20 in a horizontally balanced fashion so as to achieve an effective electric connection with the test socket 20. Therefore, the first detection device set 30 is necessary for the sake of aforementioned purpose. The first detection device set 30 comprises a first signal emission unit 31 and a first signal reception unit 32. The first signal emission unit 31 is an optical signal emission unit, whose light is generated by a signal emission device like a laser diode (LD) or a light emitting diode (LED). The first signal reception unit 32 has a light receiving element like a photodiode for detecting the optical signal emitted by the first signal emission unit 31. The first signal emission unit 31 and the first signal reception unit 32 are fixed on two different sides of the test socket 20 with screws 23. Meanwhile, the first signal emission unit 31 and the first signal reception unit 32 are disposed at positions higher than the surface of the test socket 20, and are electrically or optically connected with the control unit 40. When the IC component 10 is horizontally inserted into the groove 21 of the test socket 20, light directly emitted from the first signal emission unit 31 will be received by the first signal reception unit 32, and the first signal reception unit 32 will notify the control unit 40 of the detection result of.

Figure 5:
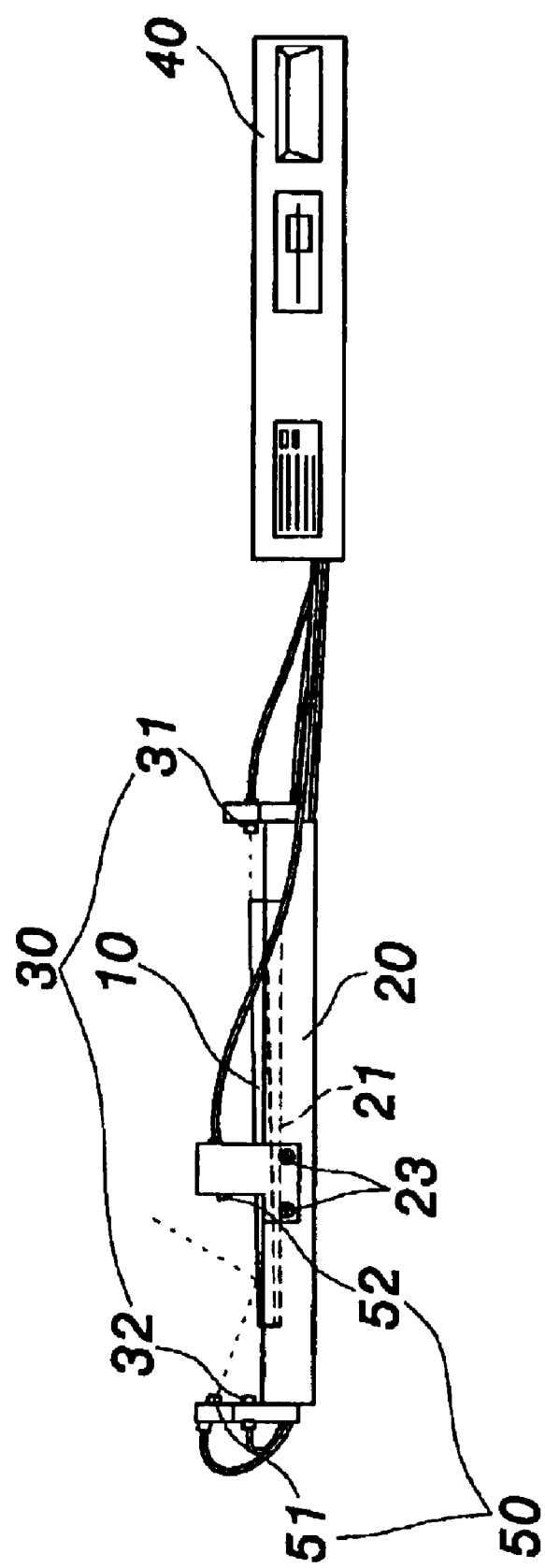
FIG. 5 is a side view of an IC component test socket assembly having an error protection device of the present invention, wherein an IC component is inserted into a groove of a test socket with the horizontal imbalance.

As shown in FIG. 5, when the IC component 10 is placed in the groove 21 of the test socket 20 with the horizontal imbalance, the optical signal directly emitted from the first signal emission unit 31 will be blocked by the IC component 10 and thus the first signal reception unit 32 receives no optical signal from the first signal emission unit 31. Meanwhile, since the first signal reception unit 32 receives no signal emitted from the first signal emission unit 31, the control unit 40 sends out an error signal to inform the operator of this error. Consequently, further electric functionality tests will not be performed. After the IC component 10 is inserted into the test socket 20 with no horizontal imbalance, meaning the optical signal directly from the first signal emission unit 31 will be received by the first signal reception unit 32, thereby the control unit 40 will acquire the normal detection result from the first signal reception unit 32 and sends no error out.

Figure 6:
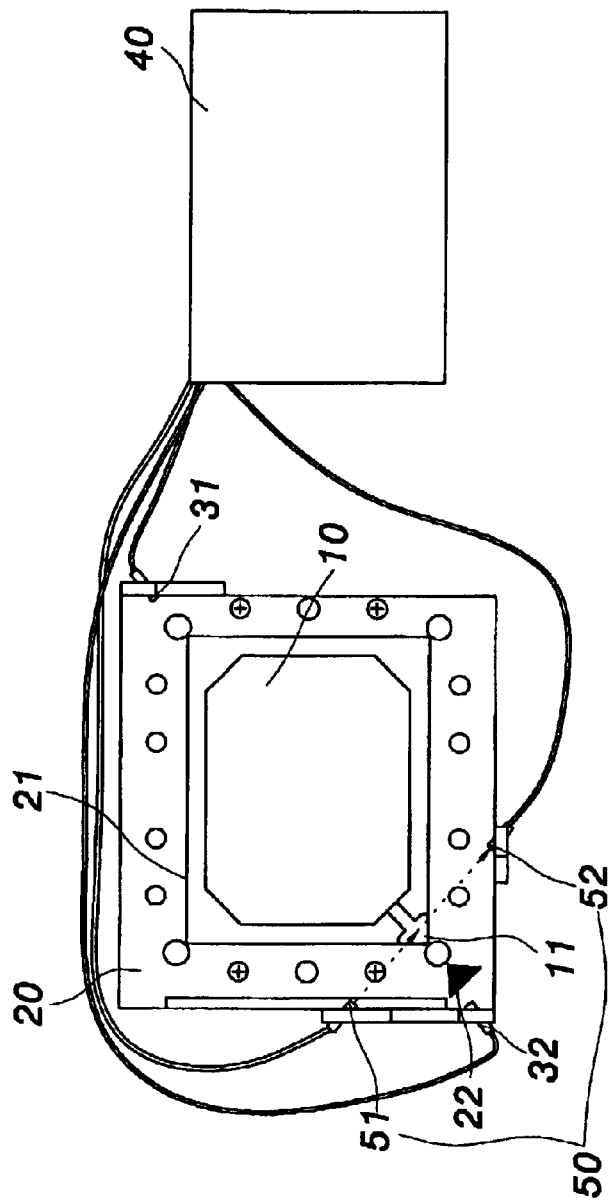
FIG. 6 is a top view of an IC component test socket assembly having an error protection device of the present invention, wherein an IC component is inserted into a test socket with the correct orientation.

As shown in FIG. 6, an orientation mark (first mark 11) is disposed on the upper end face of the IC component 10, and another orientation mark (second mark 22) is disposed at a corner of the upper end face of the test socket 20. Thereby, when the IC component 10 is inserted into the test socket 20, the first mark 11 of the IC component 10 should correspond to the second mark 22 of the test socket 20, thereby to have a correct orientation. The first mark 11 is marked by plating or pasting (e.g., a surface plated with gold) to form a metal face having a higher reflective index than that of other portions of the IC component 10.

Figure 7:
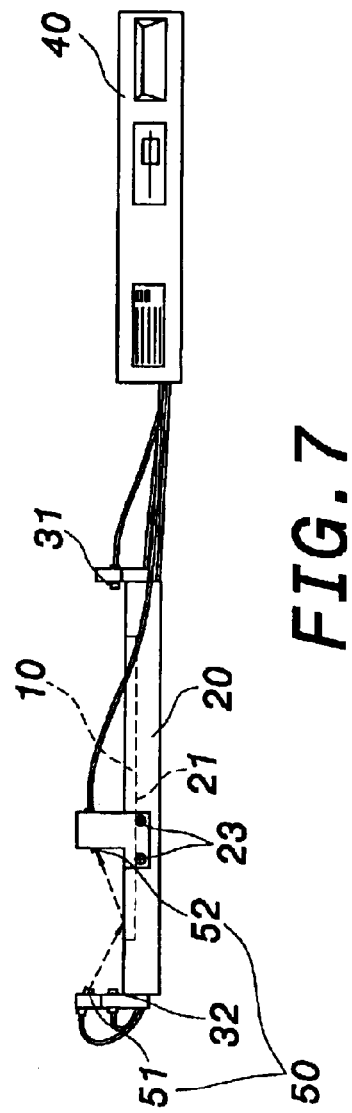
FIG. 7 is a side view of an IC component test socket assembly having an error protection device of the present invention, wherein an IC component is inserted into a test socket with the correct orientation.

Please refer to FIGS. 6 and 7. The IC component 10 is inserted into the test socket 20 with the correct orientation. That is, the first mark 11 on the upper end face of the IC component 10 corresponds to the second mark 22 on the upper end face of the test socket 20. The second detection device set 50 is disposed at different sides of the test socket 20 to detect whether the IC component 10 is inserted into the test socket 20 with a correct orientation. The second detection device set 50 comprises a second signal emission unit 51 and a second signal reception unit 52, which are fixed on two different sides of the test socket 20 with screws 23. The second signal emission unit 51 and the second signal reception unit 52 are disposed at positions higher than the surface of the test socket 20, and are electrically or optically connected with the control unit 40. The second signal emission unit 51 is an optical signal emission unit, whose light is generated by a signal emission device like a laser diode (LD) or a light emitting diode (LED). The second signal reception unit 52 has an optical reception device like a photodiode for detecting the optical signal emitted by the second signal emission unit 51. When the IC component 10 is inserted into the test socket 20 with the pre-assumed orientation setting, the second signal emission unit 51 will emit out an optical signal, which will be reflected by the first mark 11 on the upper surface of the IC component 10 and then received by the second signal reception unit 52. The detection result will be transmitted to the control unit 40. This represents a normal situation when the first mark 11 on the upper end face of the IC component 10 corresponds to the second mark 22 on the upper end face of the test socket 20.

Figure 8:
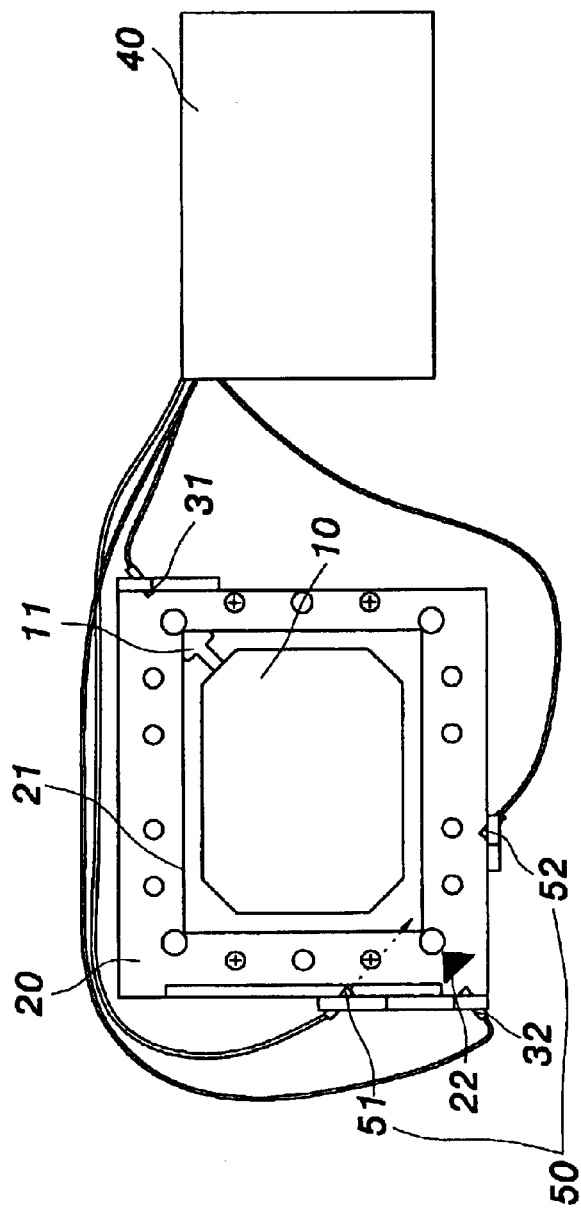
FIG. 8 is a top view of an IC component test socket assembly having an error protection device of the present invention, wherein an IC component is inserted into a test socket with an incorrect orientation.
Figure 9:
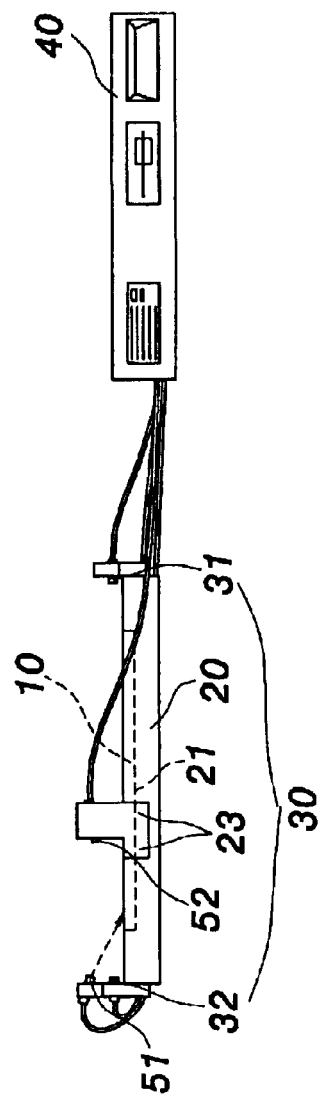
FIG. 9 is a side view of an IC component test socket assembly having an error protection device of the present invention, wherein an IC component is not inserted into a test socket correctly.

Please refer to FIGS. 8 and 9. The first mark 11 on the upper end face of the IC component 10 does not correspond to the second mark 22 on the upper end face of the test socket 20. That is, the IC component 10 is placed into the test socket 20 under the situation of incorrect orientation. In this way, the light emitted from the second signal emission unit 51 will hit other regions of the IC component 10 other than the first mark 11. Because of the characteristic of lower reflective index, other regions except the location of first mark cannot effectively reflect the optical signal of the second signal emission unit 51 to the second signal reception unit 52 (Most of the optical signal will be absorbed or scattered by the lower reflective index regions). The control unit 40 will send out an error signal to inform the operator of the occurrence of error. After the IC component 10 is under the situation of complying with the pre-assumed orientation and correctly placed, the optical signal emitted by the second signal emission unit 51 will be reflected by the first mark 11 and then be received by the second signal reception unit 52, hence ensuring that the IC component 10 is correctly inserted into and electrically connected with the test socket 20.

When the control unit 40 acquires the normal signals from the first set of detection device 30 and the second set of detection device 50, further electric functionality test operations for the IC component 10 will be resumed. Otherwise, the control unit 40 will send out an error signal to inform the operator to correct the errors, and simultaneously stop further electric functionality test operations of the IC component 10, thereby avoiding some more undesired damages to the IC component 10 itself and the test equipments.

Additionally, the IC component test socket assembly having an error protection device is applicable to semiautomatic or completely automatic system level test equipments (not shown), so that electric functionality test operations of the IC component 10 are performed in the semiautomatic or completely automatic way. Therefore, test operations can be faster and more accurate, and some inadvertencies can be avoided too. Moreover, the IC component 10 can be correctly tested by the test equipment without any damage to products and equipments.

To sum up, the IC component test socket assembly having an error protection device of the present invention determines if an IC component is placed into a test socket with the correct orientation and without horizontal imbalance, thereby enhancing the throughput and efficiency of test, reducing damages to the test equipments, and lowering the cost.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

I claim:

1. An IC component test socket assembly having an error protection device comprising:
   a test socket with a groove formed thereon for receiving an IC component to be tested;
   at least two sets of detection device comprising:
      a first set of detection device having a first signal emission unit for emitting a signal and a first signal reception unit for receiving a signal directly emitted from said first signal emission unit;
      a second set of detection device having a second signal emission unit for emitting a signal and a second signal reception unit for receiving a reflected signal emitted from said second signal emission unit; and
      a control unit for sending out an error signal if said signal reception unit receives no said signal from said signal emission unit.

2. The IC component test socket assembly having an error protection device as claimed in claim 1, wherein
   said signals emitted from said first signal emission unit and from said second signal emission unit are optical signals.

3. The IC component test socket assembly having an error protection device as claimed in claim 1, wherein
   said first signal reception unit and said second signal reception unit respectively comprises an optical reception component.

4. The IC component test socket assembly having an error protection device as claimed in claim 1, wherein
   said first signal emission unit and said first signal reception unit are disposed at two different sides of said test socket; and wherein said second signal emission unit and said second signal reception unit are disposed at two different sides of said test socket.

5. The IC component test socket assembly having an error protection device as claimed in claim 1, wherein
   said first signal emission unit and said first signal reception unit are disposed at positions higher than an upper surface of said test socket; and wherein said second signal emission unit and said second signal reception unit are disposed at a positions higher than an upper surface of said test socket.

6. The IC component test socket assembly having an error protection device as claimed in claim 1, wherein
   said IC component to be tested includes a mark region for reflecting said signal emitted from said second signal emission unit so as to generate said reflected signal.

7. The IC component test socket assembly having an error protection device as claimed in claim 6, wherein
   said mark region is a metallic surface region.

8. The IC component test socket assembly having an error protection device as claimed in claim 1, wherein
   said first set of detection device and said second set of detection device are fixed on said test socket assembly.

9. The IC component test socket assembly having an error protection device as claimed in claim 1, which is applicable to system level test equipments.

10. The IC component test socket assembly having an error protection device as claimed in claim 1, wherein said first set of detection device serves to detect whether said IC component to be tested is inserted into said groove of the test socket without horizontal imbalance.

11. The IC component test socket assembly having an error protection device as claimed in claim 1, wherein
said second set of detection device serves to detect whether said IC component to be tested is inserted into said test socket with a correct orientation.

12. The IC component test socket assembly having an error protection device as claimed in claim 1, wherein
said first set of detection device and said second set of detection device are for detecting whether said IC component to be tested is correctly inserted into said test socket.

* * * * *